(12) United States Patent
Bradley et al.

(10) Patent No.: US 7,889,024 B2
(45) Date of Patent: Feb. 15, 2011

(54) SINGLE CAVITY ACOUSTIC RESONATORS AND ELECTRICAL FILTERS COMPRISING SINGLE CAVITY ACOUSTIC RESONATORS

(75) Inventors: Paul Bradley, Los Altos, CA (US); David A. Feld, Newark, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 191 days.

(21) Appl. No.: 12/201,641

(22) Filed: Aug. 29, 2008

(65) Prior Publication Data

US 2010/0052815 A1 Mar. 4, 2010

(51) Int. Cl.
H03H 9/15 (2006.01)
H03H 9/54 (2006.01)
H03H 9/70 (2006.01)

(52) U.S. Cl. .................. 333/133; 333/187; 333/189; 310/357

(58) Field of Classification Search .......... 333/187, 333/189, 133; 310/322, 323, 334, 357, 359
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,107,721 A | 8/2000 | Lakin | |
| 6,507,983 B1 | 1/2003 | Ruby et al. | |
| 7,515,018 B2 * | 4/2009 | Handtmann et al. | 333/133 |
| 2002/0175781 A1 | 11/2002 | Wunnicke | |
| 2004/0140869 A1* | 7/2004 | Marksteiner et al. | 333/189 |
| 2006/0290446 A1 | 12/2006 | Aigner et al. | |
| 2008/0007369 A1* | 1/2008 | Barber et al. | 333/189 |
| 2008/0009274 A1 | 1/2008 | Zhu | |
| 2008/0048802 A1 | 2/2008 | Aigner et al. | |
| 2008/0055020 A1 | 3/2008 | Handtmann | |

FOREIGN PATENT DOCUMENTS

DE 10150253 4/2003

OTHER PUBLICATIONS

Lakin, K.M. et al., "High Performance Stacked Crystal Filters for GPS and Wide Bandwidth Applications", *2001 IEEE Ultrasonics Symposium*, (Jan. 1, 2001),833-838.

Lakin, K. M., "Thin Film Resonator Technology", *2003 IEEE International Frequency Control Symposium & PDA Exhibition Jointly With the 17th European Frequency and Time Forum*, Tampa, FL, May 4, 2003-May 8, 2003 section VI, VII IX; figures 5,9,13,19, (2003),765-778.

Ballato, A. et al., "A Novel Frequency Selective Device: The Stacked-Crystal Filter", *Frequency Control and Signal Processing Devices Technical Area US Army Electronics Technology and Devices Laboratory*, New Jersey, (1973),262-269.

(Continued)

*Primary Examiner*—Barbara Summons

(57) ABSTRACT

A single cavity acoustic resonator comprises: a first electrode; a second electrode; a third electrode disposed between the first electrode and the second electrode. The single cavity acoustic resonator also comprises: a first piezoelectric layer disposed between the third electrode and the first electrode, and comprising a first C-axis having an orientation; and a second piezoelectric layer disposed between the third electrode and the second electrode, and comprising a second C-axis having an orientation parallel to the first C-axis. Application of a time varying electrical signal at a drive frequency to either the third electrode or to the first and second electrodes results in a resonance of the single cavity acoustic resonator at twice a fundamental resonant frequency and a cancellation of substantially all even-order mixing products in the single cavity resonator. An electrical filter and a duplexer are also described.

15 Claims, 6 Drawing Sheets

OTHER PUBLICATIONS

Lakin, K. M., "Equivalent Circuit Modeling of Stacked Crystal Filters", *215 Reactor Building Ames Laboratory—USDOE Iowa State University*, Ames, Iowa 50011, (May 1981),257-262.

Stokes, R. B., et al., "X-Band Thin Film Acoustic Filters on GaAs", *Microwave Theory and Techniques*, IEEE, vol. 41, Issue: 6., (Jun./Jul. 1993),1075-1080.

* cited by examiner

SINGLE CAVITY ACOUSTIC RESONATORS AND ELECTRICAL FILTERS COMPRISING SINGLE CAVITY ACOUSTIC RESONATORS

BACKGROUND

Acoustic resonators based on the piezoelectric properties of certain materials are ubiquitous in many technical fields. For instance, film bulk acoustic resonators (FBARs) are used in communications devices for electrical filters, and in electrical devices for voltage transformer, to name merely a few applications. FBAR devices generate both longitudinal waves and lateral (or transverse) waves when stimulated by an applied time-varying electric field. Additionally, higher order harmonic mixing products may be generated. As is known, the lateral modes and the higher order harmonic mixing products are often not desired and can have a deleterious impact on the functionality of the FBAR-based device.

One type of electrical filter application of FBARs is a passband filter used in duplex communications. As is known by one of ordinary skill in the art, duplex filters are used to provide isolation between a transmit function of a duplexer and a receive function of the duplexer. Thus, two filters are provided, and each is designed to function within certain specifications that include prescribed pass-band transmission, out-of-band attenuation and roll-off, to name a few common specifications.

One particular specification is the so-called third generation (3G) specification proffered under the Universal Mobile Telecommunications System (UMTS). The 3G specification includes a quad-band requirement that allows mobile communication devices (e.g., cellular phones, personal digital assistants (PDAs), and portable computers) to more easily roam between different countries that peg the allowed transmission frequency at different values or to allow a better coverage in the same country.

One difficulty in addressing signal filtering (e.g., duplex filtering) in the 3G specification are higher order harmonics generated in the piezoelectric material due to non-linear properties of the piezoelectric material. These higher order harmonics produce higher order mode mixing products, which can result from both mixing products of longitudinal mode and lateral mode mixing products. Unfortunately, known acoustic filters generate these mixing products at frequencies and power levels not allowed by the 3G specification.

Certain attempts have been made to reduce the mixing products. One attempt provides separate FBARs connected to in an effort to cancel certain higher order modes. However, there are drawbacks to this known attempt. Most notably, the cancellation is poor at certain frequency ranges where parasitic lateral modes are found. Moreover, the quality (Q) factor in these separate FBAR configurations is degraded compared to known FBARs. The degradation in the Q factor is manifest in a degradation in the insertion loss in the passband of the separate FBAR devices.

Thus, the performance of a filter based on such a device is often unacceptable. Moreover, the multiple separate FBAR devices result in increased chip area for the filter. Not only does this increase the size of the filter, but also results in an increase in the cost of fabrication of the filter. Both increased chip size and increased manufacturing costs are undesired.

There is a need, therefore, for an acoustic resonator and a filter that overcomes at least the shortcoming of known resonators and filters discussed above.

SUMMARY

In a representative embodiment, a single cavity acoustic resonator comprises: a first electrode; a second electrode; a third electrode disposed between the first electrode and the second electrode. The single cavity acoustic resonator also comprises: a first piezoelectric layer disposed between the third electrode and the first electrode, and comprising a first C-axis having an orientation; and a second piezoelectric layer disposed between the third electrode and the second electrode, and comprising a second C-axis having an orientation parallel to the first C-axis. Application of a time varying electrical signal at a drive frequency to either the third electrode or to the first and second electrodes results in a resonance of the single cavity acoustic resonator at twice a fundamental resonant frequency and a cancellation of substantially all even-order mixing products in the single cavity resonator.

In another representative embodiment, an electrical filter comprises a single cavity acoustic resonator. The single cavity resonator comprises: a first electrode; a second electrode; a third electrode disposed between the first electrode and the second electrode. The single cavity acoustic resonator also comprises: a first piezoelectric layer disposed between the third electrode and the first electrode, and comprising a first C-axis having an orientation; and a second piezoelectric layer disposed between the third electrode and the second electrode, and comprising a second C-axis having an orientation parallel to the first C-axis. Application of a time varying electrical signal at a drive frequency to either the third electrode or to the first and second electrodes results in a resonance of the single cavity acoustic resonator at twice a fundamental resonant frequency and a cancellation of substantially all even-order mixing products in the single cavity resonator.

In yet another representative embodiment, a duplexer, comprises a transmit filter; and a receive filter. The transmit filter and the receive filter each comprise: a single cavity acoustic resonator. The single cavity resonator comprises: a first electrode; a second electrode; a third electrode disposed between the first electrode and the second electrode. The single cavity acoustic resonator also comprises: a first piezoelectric layer disposed between the third electrode and the first electrode, and comprising a first C-axis having an orientation; and a second piezoelectric layer disposed between the third electrode and the second electrode, and comprising a second C-axis having an orientation parallel to the first C-axis. Application of a time varying electrical signal at a drive frequency to either the third electrode or to the first and second electrodes results in a resonance of the single cavity acoustic resonator at twice a fundamental resonant frequency and a cancellation of substantially all even-order mixing products in the single cavity resonator.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DEFINED TERMINOLOGY

As used herein, the terms 'a' or 'an', as used herein are defined as one or more than one.

In addition to their ordinary meanings, the terms 'substantial' or 'substantially' mean to with acceptable limits or degree to one having ordinary skill in the art. For example, 'substantially cancelled' means that one skilled in the art would consider the cancellation to be acceptable.

In addition to their ordinary meanings, the terms 'approximately' mean to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

The present teachings are primarily directed to a single cavity acoustic resonator, an electrical filter and a duplexer. Certain aspects of the present teachings build upon components of FBAR devices, FBAR-based filters, their materials and methods of fabrication. Many details of FBARs, materials thereof and their methods of fabrication may be found in one or more of the following U.S. Patents and Patent Applications: U.S. Pat. No. 6,107,721, to Lakin; U.S. Pat. Nos. 5,587,620, 5,873,153 and 6,507,983 to Ruby, et al.; U.S. Pat. No. 7,629,865, entitled "Piezoelectric Resonator Structures and Electrical Filters" to Richard C. Ruby, et al.; U.S. Pat. No. 7,280,007, entitled "Thin Film Bulk Acoustic Resonator with Mass Loaded Perimeter" to Hongjun Feng, et al.; and U.S. Patent Application Publication 20070205850, entitled "Piezoelectric Resonator Structures and Electrical Filters having Frame Elements" to Jamneala, et al.; and U.S. Pat. No. 7,388,454, entitled "Acoustic Resonator Performance Enhancement Using Alternating Frame Structure" to Richard C. Ruby, et al. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

Figure 1:
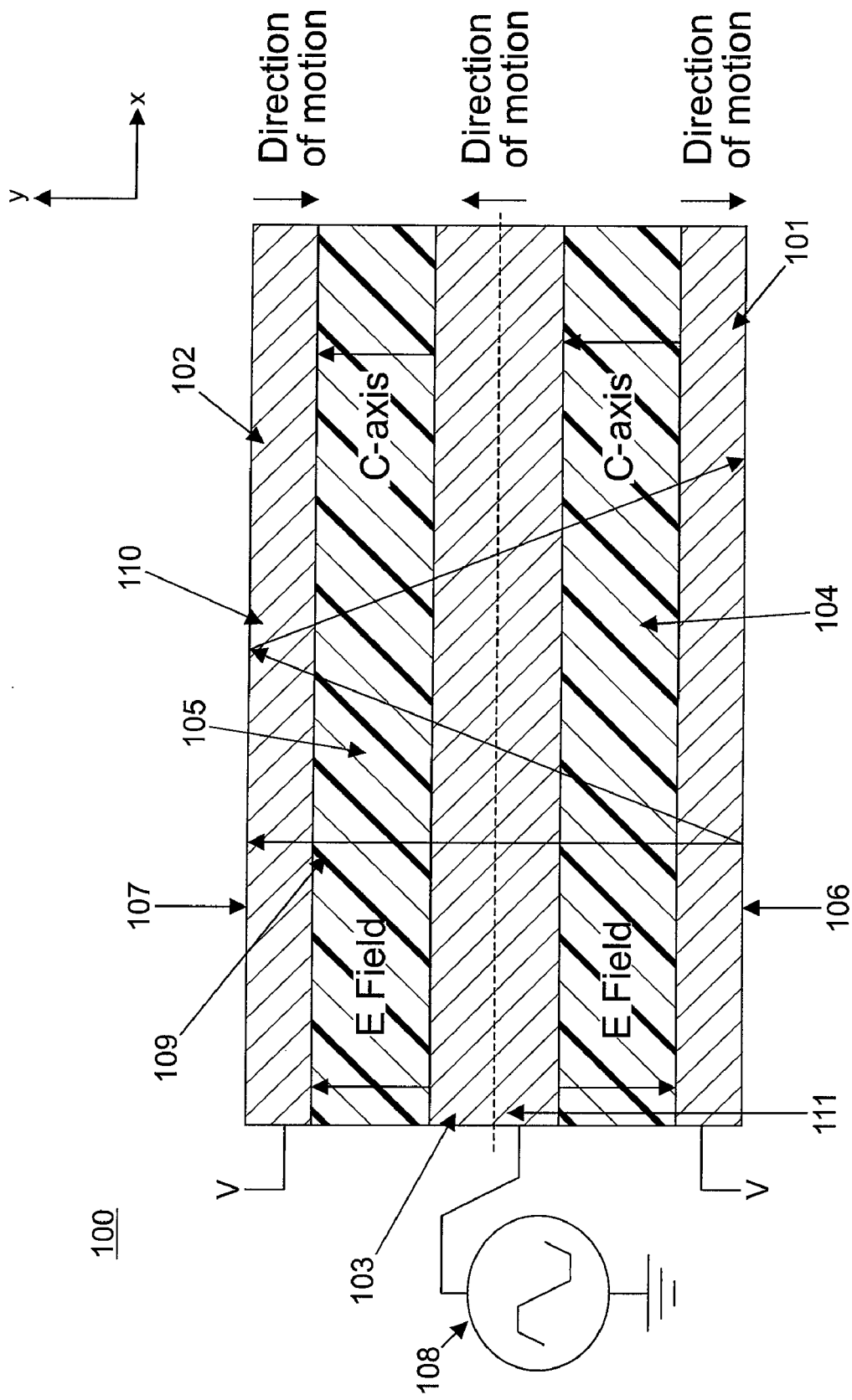
FIG. 1 is a cross-sectional view of a single cavity acoustic resonator in accordance with a representative embodiment.

FIG. 1 is a cross-sectional view of a single cavity acoustic resonator ('resonator') 100 in accordance with a representative embodiment. The resonator 100 comprises a first electrode 101, a second electrode 102 and a third electrode 103. A first piezoelectric layer 104 is disposed between the first electrode 101 and the third electrode 103; and a second piezoelectric layer 105 is disposed between the second electrode 102 and the third electrode 103. The first electrode 101 comprises an outer surface 106 and the second electrode 102 comprises and outer surface 107. The materials and thicknesses of the electrodes 101-103 and piezoelectric layer 104, 105 are selected so that a single acoustic resonant cavity is provided between the outer surfaces 106, 107.

As described more fully herein, the materials and thickness of the FBAR stack that provide the single cavity resonator are selected so that a desired fundamental longitudinal mode is supported by the single cavity resonator. Additionally, it is noted that in a representative embodiment, the first and second electrodes 101, 102 have substantially the same thickness and the third electrode 103 is approximately twice that of either of the first or second electrodes 101, 102. While this is not essential, improvements in the coupling coefficient of the third electrode 103 can be realized by selecting these thicknesses.

As should be appreciated by one of ordinary skill in the art, the resonator 100 of the presently described embodiment and filters and devices (e.g., duplexers) that comprise resonator 100 require less area than many known devices. Notably, multiple FBAR of known topologies are often connected or cascaded over a common substrate, and thus require significantly more chip 'real estate' than is required of the resonator 100 of the present teachings. This reduction in area carries over to devices incorporating the resonators 100. Reduction in space requirements is a clear benefit in microelectronics generally. In a representative embodiment, the resonator 100 provides a reduction in area of approximately 50% and a reduction in die-size of approximately 30% to approximately 40%. In addition, a capacity increase of approximately 50% capacity (number of chips) without capital expenditure with only a comparatively small (approximately 15%) increase in variable wafer cost.

Electrical connections to the resonator 100 may be configured in a various ways, however, the first electrode 101 and second electrode 102 are tied at a common electrical potential (absolute value V) to effect certain desired results described herein. In a representative embodiment, the third electrode is connected to a time-varying voltage source 108; whereas in other embodiments the first and third electrodes may be connected to a time varying voltage source and the third electrode may be connected to another voltage. The piezoelectric layers 104, 105 are illustratively AlN and exhibit substantial crystalline symmetry. Notably, the crystalline orientation of the first piezoelectric layer 104 is 'vertical' (e.g., in the +y direction in the coordinate system shown), and the crystalline orientation of the second piezoelectric layer 105 is parallel (i.e., also in the +y direction) to that of the first piezoelectric layer 104.

The C-axes of the layers 104, 105 are oriented purposefully in parallel (both in the +y direction (as shown) or both in the −y direction) to effect cancellation of second harmonic mixing products of an applied drive voltage. In particular, application of a voltage to the third electrode 103 results in an electric field generated across the first piezoelectric layer 104 and the second piezoelectric layer 105, and the inverse piezoelectric effect will result in the expansion or contraction of the piezoelectric material of the layers 104 and 105. As is known, the expansion or contraction depends on the orientation of the E-field (or more properly D-field) and the polarization (C-axis) of the piezoelectric material. A time-varying E-field causes in alternating compression and expansion of the piezoelectric material, resulting in longitudinal acoustic modes (represented conceptually as 109) and lateral (transverse) acoustic modes (represented conceptually as 110) in the single acoustic resonant cavity 100. Moreover, as alluded to above, the non-linearity of the piezoelectric material of layers 104, 105 results in higher order harmonics and higher order harmonic mixing products thereof. The magnitude (and thus power) of these higher order mixing products decreases with increasing order number. As such, left unchecked, the second order harmonic mixing products have the greatest power and potentially the greatest deleterious impact on resonator and filter performance, whereas $3^{rd}$ and higher order mixing products have an unappreciable impact on filter performance. As described more fully below, these deleterious even order mode mixing products are substantially cancelled in single cavity acoustic resonators of the representative embodiments and filters comprising such single cavity acoustic resonators. It is emphasized that the cancellation of these mixing products is in addition to suppression of parasitic lateral modes realized by other techniques, such as apodization and mass loading of electrodes.

In accordance with a representative embodiment, a time-varying electrical signal from the voltage source 108 is provided to the third electrode 103. The electrical signal has a frequency ($f_r$) that is twice the frequency of the fundamental resonant mode of the single cavity acoustic resonator 100. Thus, in the embodiment shown in FIG. 1 due to the orientations of the respective C-axes of the first and second piezoelectric layers and the time varying E-fields, at the instant in time captured, the first piezoelectric layer 104 will expand, and the second piezoelectric layer 105 will compress; and at a time $t=\lambda/2f_r$ later, the first piezoelectric layer 104 will compress, while the second piezoelectric layer will expand. Thus, because of the selective orientation of the electrical signals and the orientation of the C-axes of the first and second piezoelectric layers 104, 105 the single cavity acoustic resonator 100 is at a resonance condition at twice the frequency of the fundamental mode, with the third electrode 103 always oscillating in a direction opposite to the direction of oscillation of the first and second electrodes 101, 102 as shown. As such, an antisymmetric acoustic resonance condition exists about a (imaginary) plane of symmetry 111 through the third electrode 103 at drive (oscillation) frequency $f_r$.

By similar analysis, at even harmonics of the drive frequency $f_r$, equal and opposite acoustic oscillations are generated in the first and second piezoelectric layers 104, 105; and at particular point a distance from the plane 111 in the first piezoelectric layer 104 and at particular point in time the piezoelectric material may be in compression, while at a point equidistant from the plane 111 in the second piezoelectric layer 105 the piezoelectric material will be in expansion. Thus, the even-order harmonic mixing products in the first piezoelectric layer 104 are always out of phase by π radians relative to the even harmonic mixing products in the second piezoelectric layer 105. As a result, the non-linear piezoelectric second harmonic mixing products of both the longitudinal and lateral modes are substantially cancelled. As should be appreciated by one having ordinary skill in the art, even-order harmonic modes of higher mode number (e.g., $4^{th}$ harmonic, $6^{th}$ harmonic, etc.) are similarly substantially cancelled; and higher order odd harmonic modes (e.g., $3^{rd}$ harmonic, $5^{th}$ harmonic, etc.) have little impact on the performance of the single cavity acoustic resonator due to their comparatively low amplitude/acoustic intensity.

The connection of the voltage source 108 to the third electrode 103 is merely illustrative, and connection of the voltage source 108 to the first and second electrodes 101, 102 is contemplated without modification of the resonator 100. In particular, connection of the voltage source 108 to electrodes 101, 102 will result (at a particular moment in time) in the application of an electric field vector parallel to the c-axis in one of the piezoelectric layers 104, 105 and an electric field vector antiparallel to c-axis of the other of the layer 104, 105. An input signal from the voltage source 108 at the oscillation frequency $f_r$ will result in the desired resonance condition and the substantial cancellation by destructive interference of the second order harmonic mixing products as well as higher even order mode mixing products by the same physical mechanisms described above. In such an embodiment, the third electrode 103 may be the output of the resonator 100.

Figure 2A:
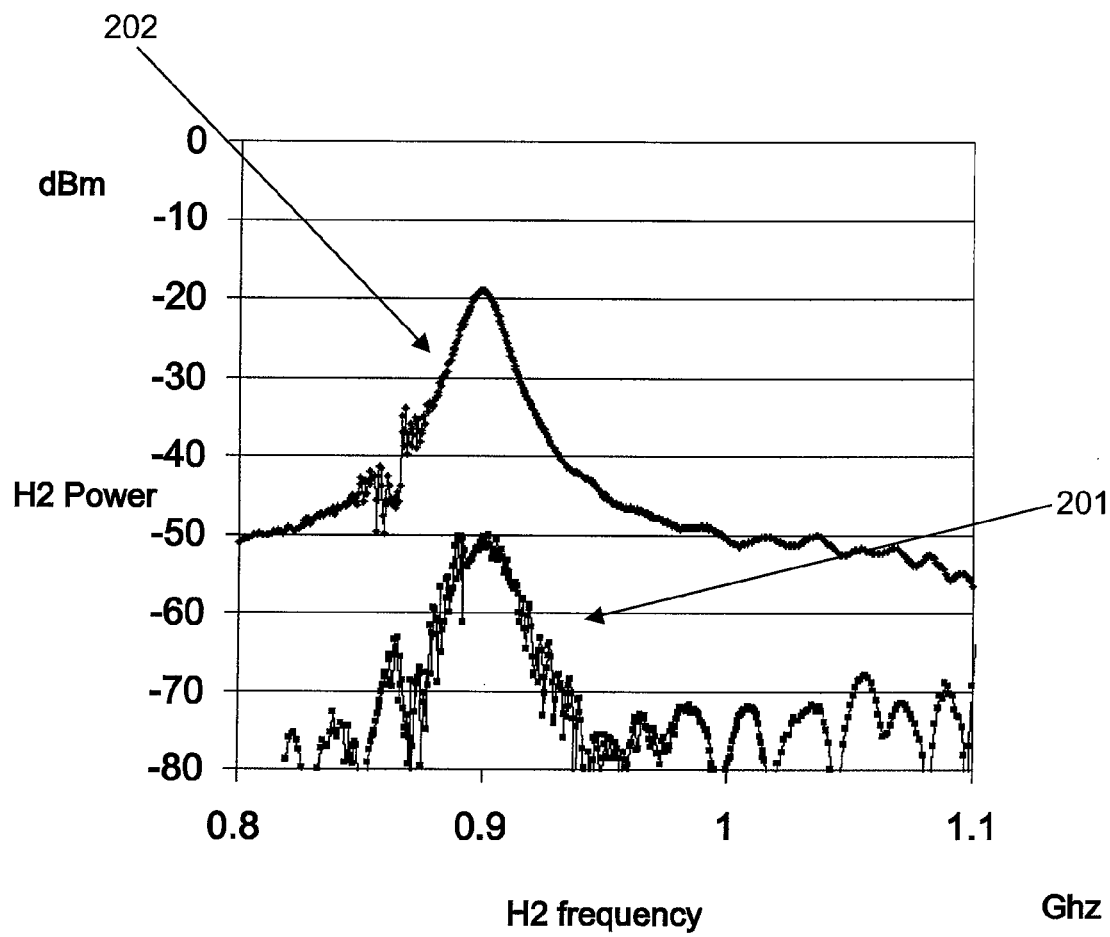
FIG. 2A is a graph of H2 signal power (dBm) versus drive frequency for a single cavity acoustic resonator of a representative embodiment and a known acoustic resonator over a frequency range of interest.

As noted previously, the substantial cancellation of deleterious even order mixing products in 3G applications is desired. The application of the resonator 100 of the illustrative embodiments is thus contemplated for use in 3G applications. In such applications, the resonator 100 is configured to have a fundamental longitudinal mode resonance at approximately 400 MHz. By the present teachings, the oscillation frequency $f_r$ is thus approximately 800 MHz; and the second order harmonic mixing products at approximately 1600 MHz are substantially cancelled. FIG. 2A illustrates the substantial cancellation of the second order harmonic (H2) mixing products in single cavity acoustic resonator 100 versus frequency in the range of approximately 850 MHz to approximately 1.1 GHz. In particular, FIG. 2A is a graph comparing H2 mixing product signal power (dBm) versus frequency for a single cavity acoustic resonator of a representative embodiment and for a known acoustic resonator over a frequency range of interest. The known acoustic resonator is illustratively a known FBAR.

For an input power of approximately +24 dBm at a drive frequency $f_r$, graph 201 shows the H2 mixing products of versus H2 frequency of the known FBAR; and graph 202 shows the H2 mixing products versus H2 frequency at the drive frequency for a single cavity acoustic resonator in accordance with a representative embodiment. A comparison of graphs 201, 202 reveals a minimum reduction of H2 mixing products of approximately 30 dBm across the frequency range shown.

Figure 2B:
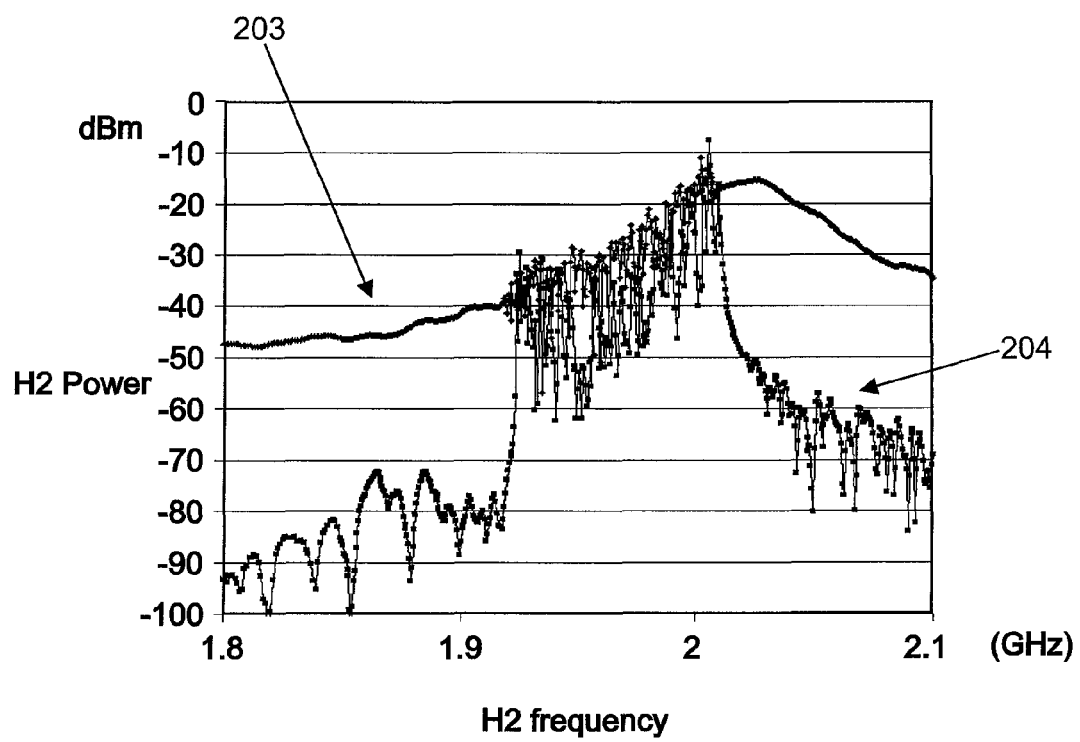
FIG. 2B is a graph of H2 signal power (dBm) versus drive frequency for two known acoustic resonators over a frequency range of interest.

For purposes of comparison, FIG. 2B shows the power spectrum of second order harmonic (H2) mixing products over a frequency range of approximately 1.8 GHz to approximately 2.1 GHz for known FBAR and known separate FBARs described above. In particular, curve 203 shows the H2 mixing products for the known FBAR and curve 204 shows the H2 mixing products for the known separate FBARs. While the separate FBARs does provide some compensation in selected portions of the spectrum shown, at approximately 1.92 GHz to approximately 2.2 GHz, little if any benefit is derived from this space-consuming and comparatively expensive configuration. Thus, the single cavity acoustic resonator 100 and devices including the resonator cavity 100 provide not only a reduced in chip area and cost, but also a comparatively significant improvement in H2 mixing product cancellation.

Figures 3A, 3B:
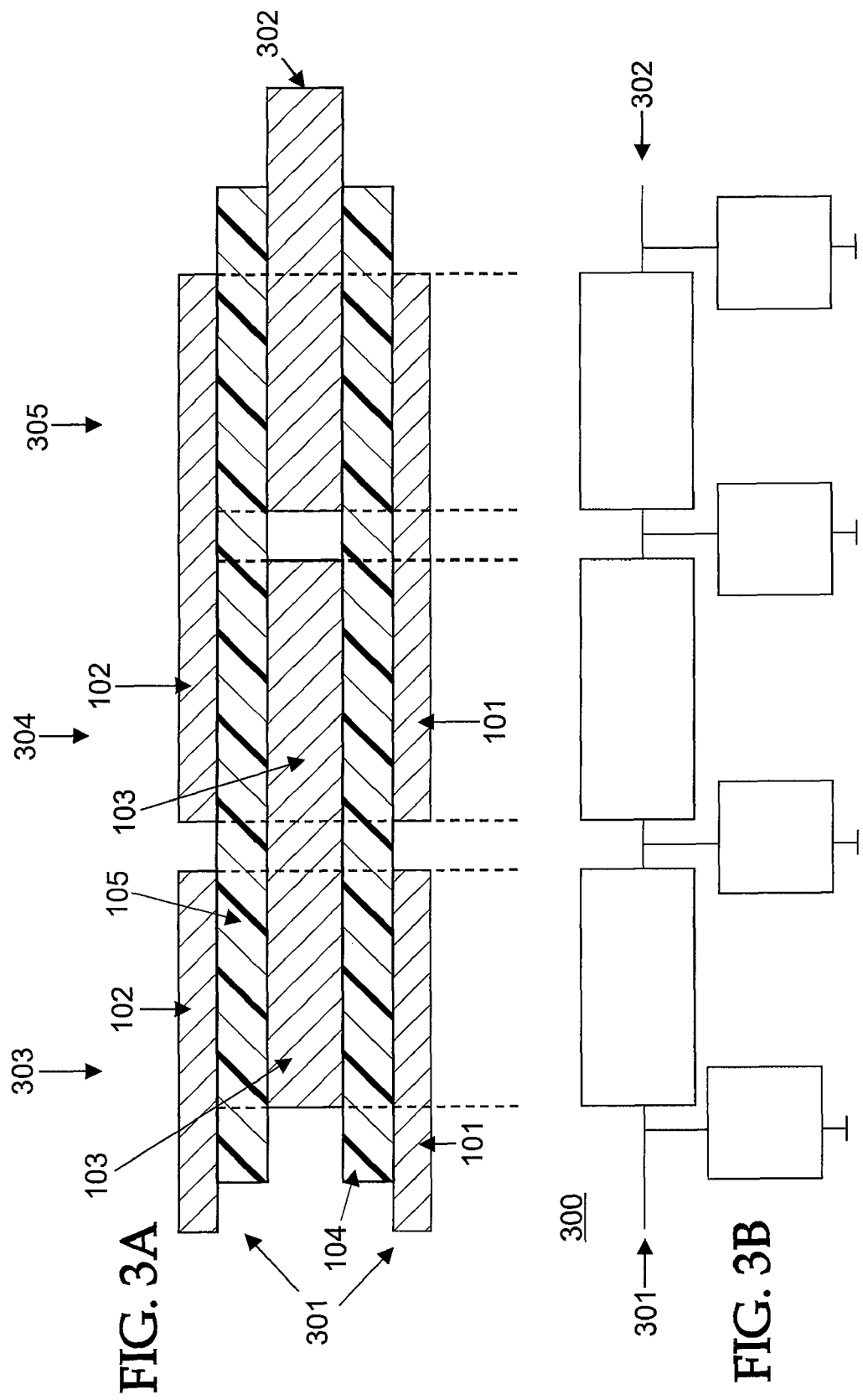
FIG. 3A is a cross-sectional view of the series resonators of a ladder filter (shown in simplified schematic view in FIG. 3B) comprising a plurality of single cavity resonators in accordance with a representative embodiment.
FIG. 3B is a simplified schematic view of a ladder filter comprising a plurality of single cavity resonators in accordance with a representative embodiment.

FIG. 3A is a cross-sectional view of series resonators of a ladder filter 300 shown in simplified schematic view in FIG. 3B. The ladder filter comprises a plurality of single cavity resonators connected in series with respective single cavity resonators connected in parallel therewith in accordance with a representative embodiment. Many of the details of the single cavity resonator 100 described previously are common to the ladder filter 300, and are not repeated to avoid obscuring the description of the present representative embodiments.

A time varying input electrical signal 301 at the drive frequency $f_r$ is provided at the first and second electrodes of a first filter stage 303, which comprises a single cavity resonator 100. As should be appreciated, the third electrode 103 of the first stage 303 provides the time varying input signal at $f_r$ to the first and second electrode 101, 102 of a second stage. As such, the first stage 303 achieves resonance by excitation of the first and second electrodes 101, 102, and the second stage 304 achieves resonance by the excitation of the third electrode 103. This sequence continues with the first and second electrodes 101, 102 of a third stage 305 providing an electrical signal at drive frequency $f_r$. An output signal 302 is provided from the third electrode 103 of the third stage as shown. Beneficially, the H2 mixing products are substantially cancelled at each stage in a manner described previously. Furthermore, a significant benefit is derived by the configuration of the single cavity resonators of each stage of filter 300 because interconnecting vias are not needed to effect connections between the various electrodes 101-103 both within a stage and from one stage to the next.

Figure 4:
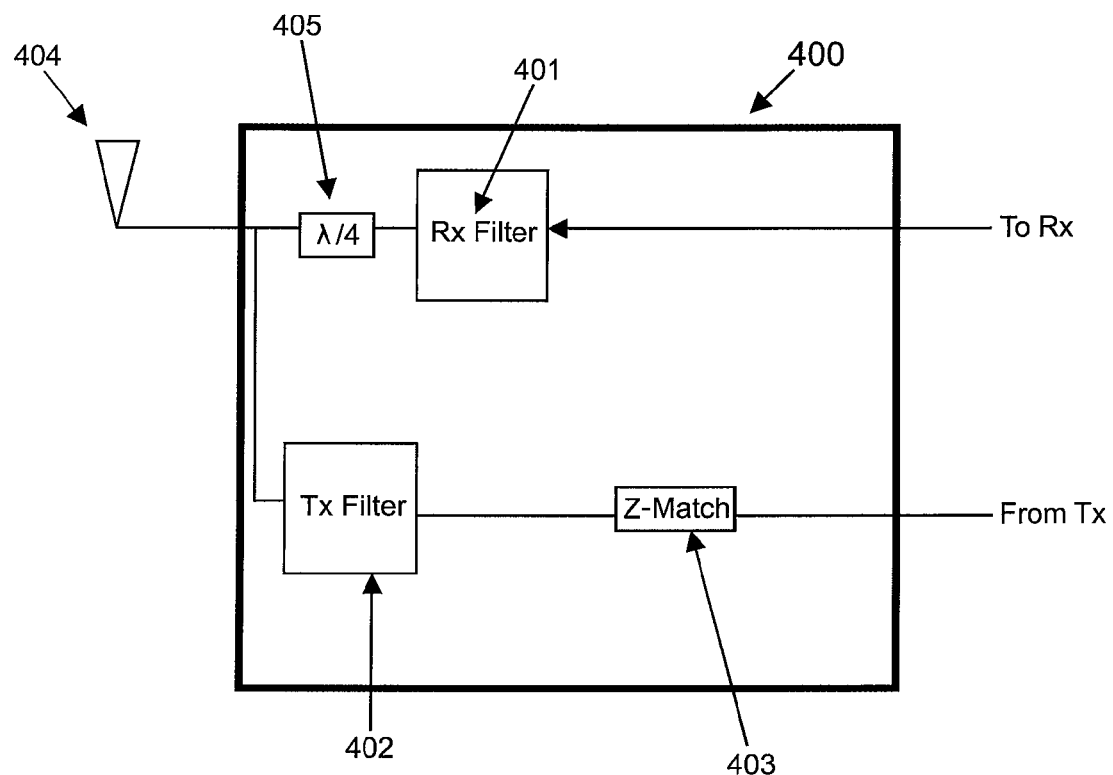
FIG. 4 is a simplified schematic view of a duplexer comprising a transmit (Tx) filter and a receive (Rx) filter, each comprising a single cavity resonator in accordance with a representative embodiment.

FIG. 4 is a simplified schematic view of a duplexer 400 comprising a receive (Rx) filter 401 and a transmit (Tx) filter 402, each comprising a single cavity resonator in accordance with a representative embodiment. The filters 401, 402 may each comprise ladder filter 300 or other filter configurations. Common to all contemplated filter configurations of the duplexer 400 is single cavity acoustic resonators 100 of representative embodiments.

A signal from a transmitter (not shown) is input to an impedance transformer (e.g., a quarter wave stub) 403 and is input to the Tx filter 402. After filtering, the signal is transmitted ultimately to an antenna 404.

A received signal from the antenna 404 is input to an impedance transformer 405 (shown as a quarter-wave transmission line) the Rx filter 401 and after filtering is input to another impedance transformer 404 and then to a receiver (not shown).

Figure 5:
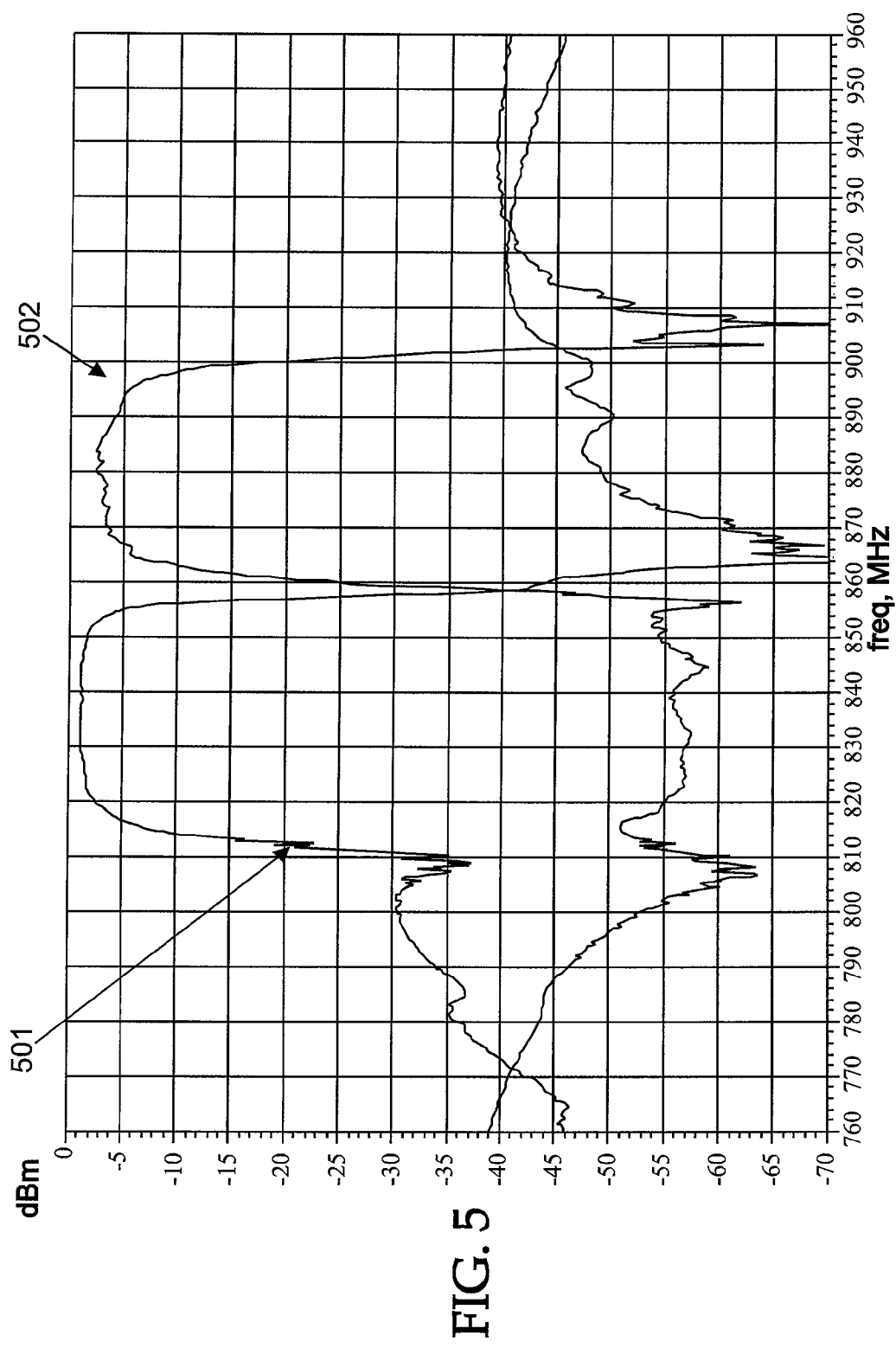
FIG. 5 is a graphical representation of selected S-parameters versus frequency of a duplexer each comprising a transmit (Tx) filter and a receive (Rx) filter, each comprising a single cavity resonator in accordance with a representative embodiment.

FIG. 5 is a graphical representation of selected S-parameters versus frequency of a duplexer each comprising a transmit (Tx) filter and a receive (Rx) filter, each comprising a single cavity resonator in accordance with a representative embodiment. The duplexer may be duplexer 400 including filters described in conjunction with this and other embodiments. Curve 501 shows the bandpass characteristics of the transmit side of the duplexer, with rejection, out-of-band attenuation and roll-off within acceptable limits (e.g., to within the 3G specification). Similarly, curve 502 shows the receive-side of the duplexer, again with acceptable rejection, out-of-band attenuation and roll-off within acceptable limits.

In view of this disclosure it is noted that the various single cavity acoustic resonators and filters incorporating these resonators described herein can be implemented in a variety of materials, variant structures, configurations and topologies. Moreover, applications other than resonator filters may benefit from the present teachings. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:

1. A single cavity acoustic resonator, comprising:
a first electrode;
a second electrode;
a third electrode disposed between the first electrode and the second electrode wherein the first and second electrodes comprise a substantially identical thickness, and the third electrode comprises a thickness that is approximately twice as great as the thickness of the first and second electrodes;
a first piezoelectric layer disposed between the third electrode and the first electrode, and comprising a first C-axis having an orientation; and
a second piezoelectric layer disposed between the third electrode and the second electrode, and comprising a second C-axis having an orientation parallel to the first C-axis, wherein application of a time varying electrical signal at a drive frequency to either the third electrode or to the first and second electrodes results in a resonance of the single cavity acoustic resonator at approximately twice a fundamental resonant frequency and a substantial cancellation of substantially all even-order mixing products in the single cavity resonator.

2. A single cavity acoustic resonator as claimed in claim 1, wherein a single resonant cavity is between an outer surface of the first electrode and an outer surface of the second electrode.

3. A single cavity acoustic resonator as claimed in claim 2, wherein the fundamental frequency is approximately 400 MHz.

4. A single cavity acoustic resonator as claimed in claim 1, wherein the even-order mixing products comprise longitudinal mode mixing products and lateral mode mixing products.

5. A single cavity acoustic resonator as claimed in claim 1, wherein the electrical signal at the drive frequency is applied to the first and second electrodes, and the third electrode is connected to another electrical potential.

6. A single cavity acoustic resonator as claimed in claim 1, wherein the electrical signal at the drive frequency is applied to the third electrode.

7. A single cavity acoustic resonator as claimed in claim 6, wherein the first and second electrodes are connected to substantially the same electrical potential.

8. An electrical filter, comprising:
a single cavity acoustic resonator, comprising: a first electrode; a second electrode; a third electrode disposed between the first electrode and the second electrode, wherein the first and second electrodes comprise a substantially identical thickness, and the third electrode comprises a thickness that is approximately twice as great as the thickness of the first and second electrodes; a first piezoelectric layer disposed between the third electrode and the first electrode, and comprising a first C-axis having an orientation; and a second piezoelectric layer disposed between the third electrode and the second electrode, and comprising a second C-axis having an orientation parallel to the first C-axis, wherein application of a time varying electrical signal at a drive frequency to either the third electrode or to the first and second electrodes results in a resonance of the single cavity acoustic resonator at approximately twice a fundamental resonant frequency and a cancellation of substantially all even-order mixing products in the single cavity resonator.

9. An electrical filter as claimed in claim 8, further comprising a plurality of the single cavity acoustic resonators arranged in a ladder structure, wherein the time varying electrical signal at the drive frequency is applied at the first and second electrodes of a first single acoustic cavity resonator of the plurality of single cavity acoustic resonators, and an output signal is retrieved from a third electrode of a last single cavity acoustic resonator of the plurality of single cavity acoustic resonators.

10. An electrical filter as claimed in claim 8, further comprising a plurality of the single cavity acoustic resonators arranged in a ladder structure, wherein the time varying electrical signal at the drive frequency is applied to the third electrode of a first single cavity acoustic resonator of the plurality of single cavity acoustic resonators, and an output signal is retrieved from a first and a second electrode of a last single cavity acoustic resonator of the plurality of single cavity acoustic resonators.

11. An electrical filter as claimed in claim 8, wherein second-order mixing products are reduced by at least 30 dBm.

12. An electrical filter as claimed in claim 8, wherein the even-order mixing products comprise both longitudinal mode mixing products and lateral mode mixing products.

13. A duplexer, comprising:
a transmit filter; and a receive filter, each comprising: a single cavity acoustic resonator, comprising: a first electrode; a second electrode; a third electrode disposed between the first electrode and the second electrode, wherein the first and second electrodes comprise a substantially identical thickness, and the third electrode comprises a thickness that is approximately twice as great as the thickness of the first and second electrodes; a first piezoelectric layer disposed between the third electrode and the first electrode, and comprising a first C-axis having an orientation; and a second piezoelectric layer disposed between the third electrode and the second electrode, and comprising a second C-axis having an orientation parallel to the first C-axis, wherein application of a time varying electrical signal at a drive frequency to either the third electrode or to the first and second electrodes results in a resonance of the single cavity acoustic resonator at approximately twice a fundamental resonant frequency and a cancellation of substantially all even-order mixing products in the single cavity resonator.

14. A duplexer as claimed in claim 13, wherein a single resonant cavity is between an outer surface of the first electrode and an outer surface of the second electrode and the drive frequency is two times a fundamental frequency of the single cavity.

15. A duplexer as claimed in claim 13, wherein the even-order mixing products comprise longitudinal mode mixing products and lateral mode mixing products.

* * * * *